(12) United States Patent
Toyao et al.

(10) Patent No.: US 9,084,351 B2
(45) Date of Patent: Jul. 14, 2015

(54) STRUCTURE AND CIRCUIT BOARD HAVING REPEATEDLY ARRANGED CONNECTION MEMBERS

(75) Inventors: Hiroshi Toyao, Tokyo (JP); Naoki Kobayashi, Tokyo (JP); Noriaki Ando, Tokyo (JP)

(73) Assignee: NEC CORPORATION, Tokyo (JP)

( * ) Notice: Subject to any disclaimer, the term of this patent is extended or adjusted under 35 U.S.C. 154(b) by 289 days.

(21) Appl. No.: 13/583,277

(22) PCT Filed: Feb. 18, 2011

(86) PCT No.: PCT/JP2011/000907
§ 371 (c)(1),
(2), (4) Date: Sep. 7, 2012

(87) PCT Pub. No.: WO2011/111312
PCT Pub. Date: Sep. 15, 2011

(65) Prior Publication Data
US 2013/0037316 A1 Feb. 14, 2013

(30) Foreign Application Priority Data
Mar. 8, 2010 (JP) .................................. 2010-051091

(51) Int. Cl.
*H04B 3/28* (2006.01)
*H05K 1/02* (2006.01)
*H01P 3/00* (2006.01)

(52) U.S. Cl.
CPC ............... *H05K 1/0236* (2013.01); *H01P 3/00* (2013.01); *H05K 1/0298* (2013.01)

(58) Field of Classification Search
CPC ........ H01P 1/2005; H01P 1/203; H05K 1/026
USPC ........................... 333/12, 168, 185, 204, 216
See application file for complete search history.

(56) References Cited

U.S. PATENT DOCUMENTS

| 6,262,495 B1 | 7/2001 | Yablonovitch et al. |
| 2008/0185179 A1 | 8/2008 | Kim et al. |
| 2008/0266018 A1 | 10/2008 | Han et al. |
| 2013/0057362 A1* | 3/2013 | Wu et al. ................. 333/204 |

FOREIGN PATENT DOCUMENTS

| JP | 7-263908 A | 10/1995 |
| JP | 2007-165857 A | 6/2007 |

(Continued)

OTHER PUBLICATIONS

The international search report for PCT/JP2011/000907 mailed on Mar. 22, 2011.

(Continued)

*Primary Examiner* — Robert Pascal
*Assistant Examiner* — Kimberly Glenn
(74) *Attorney, Agent, or Firm* — Sughrue Mion, PLLC

(57) ABSTRACT

A structure (10) includes a conductor (151), conductors (111, 131) that are located on the same side with respect to the conductor (151), that are opposed to at least a part of the conductor (151), and that overlap each other when seen in a plan view, a connection member (101) that penetrates the conductors (111, 131, 151), that is connected to the conductor (151), and that is insulated from the conductors (111, 131), openings (112, 132) that are formed in the conductors (111, 131), respectively, and which the connection member (101) passes through, and conductor elements (121, 141) that are formed to be opposed to the openings (112, 132), that are connected to the connection member (101) passing through the openings (112, 132), and that are larger than the openings (112, 132). The number of layers in which the conductor elements (121, 141) are located is two or more and less than or equal to the number of layers in which the conductors (111, 131) are located.

20 Claims, 12 Drawing Sheets

(56) References Cited

FOREIGN PATENT DOCUMENTS

| | | | |
|---|---|---|---|
| JP | 2008193074 | A | 8/2008 |
| JP | 2008277755 | A | 11/2008 |

OTHER PUBLICATIONS

Japanese Office Action for JP Application No. 2012-504299 mailed on Aug. 5, 2014 with Partial English Translation.

* cited by examiner

STRUCTURE AND CIRCUIT BOARD HAVING REPEATEDLY ARRANGED CONNECTION MEMBERS

TECHNICAL FIELD

The present invention relates to a structure and a circuit board.

BACKGROUND ART

In recent years, it has been known that propagation characteristics of electromagnetic waves can be controlled by periodically arranging a conductor pattern having a specific structure (hereinafter, referred to as a metamaterial). Particularly, a metamaterial constructed to suppress propagation of electromagnetic waves in a specific frequency band is referred to as an electromagnetic bandgap structure (hereinafter, referred to as an EBG structure). The EBG structure is used as a countermeasure against noise propagating in a circuit board or the like.

An example of such a technique is described in Patent Document 1 (U.S. Pat. No. 6,262,495). FIG. 2 of Patent Document 1 shows a structure, that is, a mushroom-like EBG structure, in which plural island-like conductor elements are arranged over a sheet-like conductive plane and the respective island-like conductor elements are connected to the conductive plane through vias.

RELATED DOCUMENT

Patent Document

[Patent Document 1] U.S. Pat. No. 6,262,495

DISCLOSURE OF THE INVENTION

However, when the above-mentioned EBG structure is applied as a countermeasure against noise propagating between conductive layers formed in a circuit board, a layer in which the island-like conductor elements are arranged is added and thus the number of layers stacked in the circuit board increases, thereby raising the thickness of the circuit board. Particularly, this tendency is marked in a multi-layered circuit board including plural conductive layers.

The invention is made in consideration of the above-mentioned circumstances and an object thereof is to provide a structure or a circuit board which is subjected to a noise countermeasure using an EBG structure between conductive layers and which can be formed with a very small thickness.

According to an aspect of the invention, there is provided a structure including: a first conductor; a plurality of second conductors that are located on the same side with respect to the first conductor, that are opposed to at least a part of the first conductor, and that overlap each other when seen in a plan view; a connection member that penetrates the first conductor and the plurality of second conductors, that is connected to the first conductor, and that is insulated from the second conductors; openings that are formed in the plurality of second conductors, respectively, and which the connection member passes through; and third conductors that are formed to be opposed to the openings, that are connected to the connection member passing through the openings, and that are larger than the openings, wherein the number of layers in which the third conductors are located is two or more and less than or equal to the number of layers in which the second conductors are located.

According to another aspect of the invention, there is provided a circuit board having a structure, the structure including: a first conductor; a plurality of second conductors that are located on the same side with respect to the first conductor, that are opposed to at least a part of the first conductor, and that overlap each other when seen in a plan view; a connection member that penetrates the first conductor and the plurality of second conductors, that is connected to the first conductor, and that is insulated from the second conductors; openings that are formed in the plurality of second conductors, respectively, and which the connection member passes through; and third conductors that are formed to be opposed to the openings, that are connected to the connection member passing through the openings, and that are larger than the openings, wherein the number of layers in which the third conductors are located is two or more and less than or equal to the number of layers in which the second conductors are located.

According to still another aspect of the invention, there is provided a structure including: a first conductor; a plurality of second conductors that are located on the same side with respect to the first conductor, that are opposed to at least a part of the first conductor, and that overlap each other when seen in a plan view; a connection member that penetrates the first conductor and the plurality of second conductors, that is connected to the first conductor, and that is insulated from the second conductors; openings that are formed in the plurality of second conductors, respectively, and which the connection member passes through; and third conductors that are formed to be opposed to the openings, that are connected to the connection member passing through the openings, and that are larger than the openings, wherein a first parallel plate formed by the first conductor and the second conductors and a second parallel plate formed by the plurality of second conductors constitute an electromagnetic bandgap structure by sharing the connection member and the third conductor.

According to the aspects of the invention, it is possible to provide a structure and a circuit board which is subjected to a noise countermeasure using an EBG structure between conductive layers and which can be formed with a very small thickness.

DESCRIPTION OF EMBODIMENTS

Figure 1:
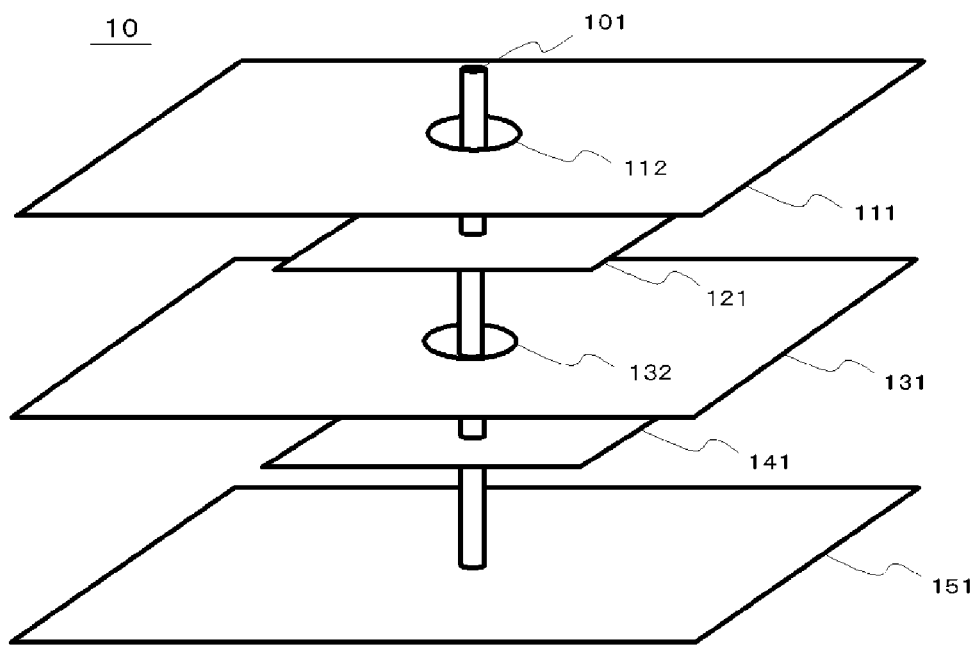
FIG. 1 is a perspective view illustrating an example of a structure according to an embodiment of the invention.

Hereinafter, embodiments of the invention will be described with reference to the accompanying drawings. In all the drawings, like elements are referenced by like reference numerals and will not be repeatedly described.

FIG. 1 is a perspective view illustrating an example of a structure 10 according to an embodiment of the invention. The structure 10 is constructed by various conductive elements formed in a circuit board 100 having at least an A layer 11, a B layer 12, a C layer 13, a D layer 14, and an E layer 15 (see FIG. 9).

In the structure 10 shown in FIG. 1, a conductor 151, a conductor element 141, a conductor 131, a conductor element 121, and a conductor 111 are sequentially stacked in this order with respect to the conductor 151. The structure 10 includes the conductor 151 (the first conductor) and the conductor 111 and the conductor 131 (plural second conductors) that are located on the same side with respect to the conductor 151, that are opposed to at least a part of the conductor 151, and that overlap each other when seen in a plan view. The structure 10 includes a connection member 101 that penetrates the conductor 111, the conductor 131, and the conductor 151, that is connected to the conductor 151, and that is insulated from the conductor 111 and the conductor 131. The structure 10 includes an opening 112 and an opening 132 that are disposed in the conductor 111 and the conductor 131, respectively, and which the connection member 101 passes through. The structure 10 includes the conductor element 121 (the third conductor) that is formed to be opposed to the opening 112, that is connected to the connection member 101 passing through the opening 112, and that is larger than the opening 112. The structure 10 includes the conductor element 141 (the third conductor) that is formed to be opposed to the opening 132, that is connected to the connection member 101 passing through the opening 132, and that is larger than the opening 132. The opening 112 and the conductor element 121 are opposed to each other without another conductive plane interposed therebetween and the opening 132 and the conductor element 141 are opposed to each other without another conductive plane interposed therebetween.

In this embodiment, the number of layers in which the conductor element 121 or the conductor element 141 (the third conductors) is located is equal to the number of layers in which the conductor 111 and the conductor 131 (the second conductors) are located. In addition, in this embodiment, the number of the conductor elements 121 and the conductor elements 141 (the third conductors) is equal to the number of the openings 112 and the openings 132 through which the connection member 101 passes.

In this embodiment, the conductor 111 is closer to the conductor element 121 than another conductive plane including the conductor 151 or the conductor 131. The conductor 131 is closer to the conductor element 141 than another conductive plane including the conductor 151 or the conductor 111. The conductor 111 and the conductor 131 are continuous in the thickness direction and do not interpose another conductive plane therebetween. Here, "be continuous in the thickness direction" means that the numbers are continuous, for example, when the conductive planes included in the structure 10 are numbered with respect to the conductor 151. Smaller conductor patterns such as interconnects may be included between the conductor 111 and the conductor 131 which are continuous in the thickness direction without any electrical influence thereon, and all the conductors are not excluded.

Here, the connection member 101 may not completely penetrate the conductors located at both ends of the conductors 111, 131, and 151. That is, at least a part of the connection member 101 has only to be formed in the conductors located at both ends.

The connection member 101, the conductor 111, the conductor element 121, the conductor 131, the conductor element 141, and the conductor 151 may be formed of the same material or different materials, as long as they are formed of a conductive material.

The structure 10 may include layers other than the A layer 11, the B layer 12, the C layer 13, the D layer 14, and the E layer 15. For example, a dielectric layer may be located between the respective layers. The structure 10 may further include holes, vias, signal lines, and the like not shown in the drawings without conflicting the configuration of the invention.

The opening 112 or the opening 132 may not necessarily be hollow, but may be filled with a dielectric. That is, the connection member 101 may be formed to penetrate the dielectric filled in the opening 112 or the opening 132 and not to come in contact with the conductor 111 or the conductor 131.

In the structure 10, it is preferable that the conductor 151 connected to the connection member 101 function as a ground with a reference potential applied thereto.

It is assumed that the conductor 111 is located in the A layer 11, the conductor element 121 is located in the B layer 12, the conductor 131 is located in the C layer 13, the conductor element 141 is located in the D layer 14, and the conductor 151 is located in the E layer 15. The relative positional relationship of the A layer 11, the B layer 12, the C layer 13, the D layer 14, and the E layer 15 can be changed and thus the relative positional relationship of the conductor 111, the conductor element 121, the conductor 131, the conductor element 141, and the conductor 151 can be changed.

By employing the above-mentioned configuration, a parallel plate including the conductor 111 and the conductor 131 can constitute at least a part of an electromagnetic bandgap structure along with the conductor element 121, the conductor element 141, and the connection member 101. A parallel plate including the conductor 131 and the conductor 151 can constitute at least a part of an electromagnetic bandgap structure along with the conductor element 141 and the connection member 101.

Figure 2:
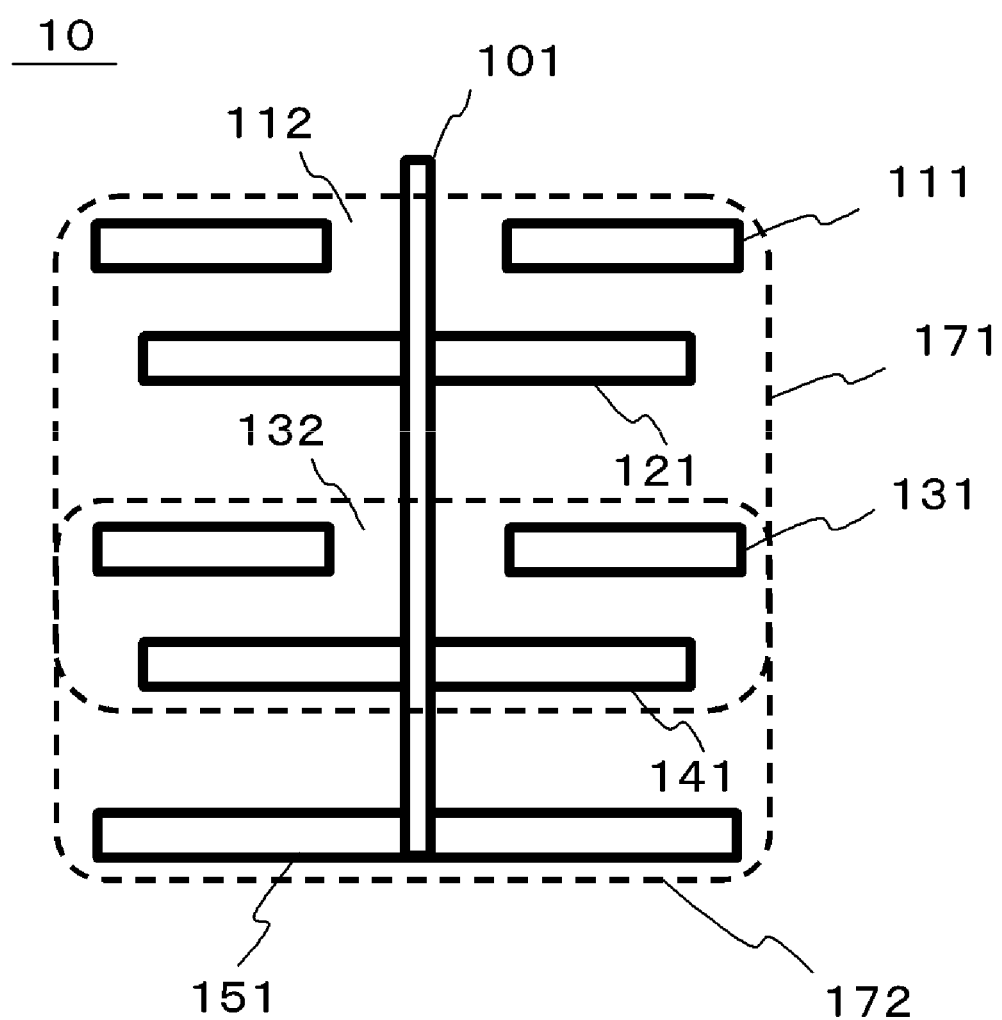
FIG. 2 is a cross-sectional view of the structure shown in FIG. 1.

FIG. 2 is a cross-sectional view of the structure 10 shown in FIG. 1. In FIG. 2, the spaces surrounded with dotted lines indicate EBG structures, which are referred to as an EBG structure 171 and an EBG structure 172. The EBG structure 171 is constituted by the conductor 111, the conductor 131, the conductor element 121, the conductor element 141, and the connection member 101. The EBG structure 172 is constituted by the conductor 131, the conductor 151, the conductor element 141, and the connection member 101.

That is, the single structure 10 constitutes the EBG structure 171 and the EBG structure 172. The conductor 131, the conductor element 141, and the connection member 101 are shared by both the EBG structure 171 and the EBG structure 172. Accordingly, compared with a case where the EBG structure according to the related art is formed for each parallel plate, the EBG structure in the invention can reduce the thickness of the circuit board.

The structure 10 shown in FIG. 1 or 2 is an example where a mushroom-like EBG structure is modified. The connection member 101 corresponds to the stem part of a mushroom and forms inductance. On the other hand, the conductor element 121 corresponds to the head part of the mushroom and forms capacitance along with the opposed conductor 111. The conductor element 141 corresponds to the head part of the mushroom and forms capacitance along with the opposed conductor 131.

Similarly to the mushroom-like EBG structure, the structure 10 shown in FIG. 1 or 2 can be expressed by an equivalent circuit in which a parallel plate is shunted with a serial resonance circuit including the capacitance and the inductance and the resonance frequency of the serial resonance circuit gives the central frequency of a bandgap. Accordingly, it is possible to achieve the fall in frequency of the bandgap range by causing the conductor element 121 to approach the conductor 111 forming the capacitance to increase the capacitance. It is possible to achieve the fall in frequency of the bandgap range by causing the conductor element 141 to approach the conductor 131 forming the capacitance to increase the capacitance. However, even when the conductor element 121 is not made to approach the opposed conductor 111, the substantial effect of the invention is not affected at all. Even when the conductor element 141 is not made to approach the opposed conductor 131, the substantial effect of the invention is not affected at all.

By adjusting the gap between the conductor 111 and the conductor element 121, the gap between the conductor element 121 and the conductor 131, the gap between the conductor 131 and the conductor element 141, the gap between the conductor element 141 and the conductor 151, the thickness of the connection member 101, the mutual gap of the conductor element 121 or the conductor element 141, and the like, it is possible to set the frequency band (bandgap range), in which the propagation of electromagnetic waves should be suppressed, to a desired value.

Figure 3:
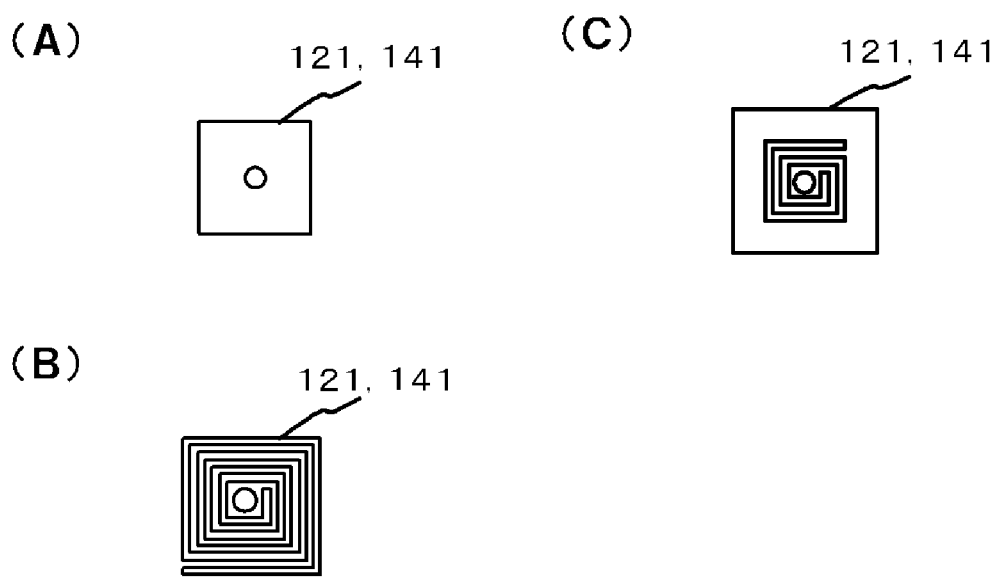
FIG. 3 is a diagram illustrating modifications of a conductor element.

FIG. 3 is a diagram illustrating modifications of the conductor element 121 or the conductor element 141 in the structure 10 shown in FIG. 1. FIG. 3(A) is a top view of the conductor element 121 or the conductor element 141 used in the structure 10 shown in FIG. 1. The conductor element 121 or the conductor element 141 has a rectangular shape. However, the conductor element 121 or the conductor element 141 constituting the mushroom-like structure 10 is not limited to the rectangular shape, but may have a polygonal shape such as a triangular shape or a hexagonal shape or a circular shape.

FIG. 3(B) is a top view illustrating an example of the conductor element 121 or the conductor element 141 in the structure 10 shown in FIG. 1. The conductor element 121 or the conductor element 141 shown in the drawing is a spiral transmission line formed in a planar direction, where one end thereof is connected to the connection member 101 and the other end thereof is an open end. By employing the conductor element 121 or the conductor element 141 shown in the drawing, the structure 10 can constitute an open stub type EBG structure in which a microstrip line including the conductor element 121 or the conductor element 141 serves as an open stub. The connection member 101 forms inductance. On the other hand, the conductor element 121 is electrically coupled to the conductor 111 to form a microstrip line having the conductor 111 as a return path. The conductor element 141 is electrically coupled to the conductor 131 to form a microstrip line having the conductor 131 as a return path.

The open stub type EBG structure can be expressed by an equivalent circuit in which a parallel plate is shunted with a serial resonance circuit including the open stub and the inductance and the resonance frequency of the serial resonance circuit gives the central frequency of a bandgap. Accordingly, by increasing the stub length of the open stub including the conductor element 121 or the conductor element 141, it is possible to achieve a fall in frequency of the bandgap range.

It is preferable that the conductor element 121 constituting the microstrip line and the opposed conductor 111 be located close to each other. It is preferable that the conductor element 141 constituting the microstrip line and the opposed conductor 131 be located close to each other. This is because as the distance between the conductor element and the opposed plane becomes smaller, the characteristic impedance of the microstrip line becomes lower, thereby widening the bandgap range. However, even when the conductor element 121 is not made to approach the opposed conductor 111, the substantial effect of the invention is not affected at all. Even when the conductor element 141 is not made to approach the opposed conductor 131, the substantial effect of the invention is not affected at all.

FIG. 3(C) is a top view illustrating an example of the conductor element 121 or the conductor element 141 in the structure 10 shown in FIG. 1. The conductor element 121 or the conductor element 141 shown in the drawing is a rectangular conductor and has an opening. In the opening, a spiral inductor of which an end is connected to the edge of the opening and the other end is connected to the connection member 101 is formed. By employing the conductor element 121 or the conductor element 141 shown in the drawing, the structure 10 can constitute an inductance-increased EBG structure in which inductance is increased by forming an inductor in the head part of a mushroom in a mushroom-like EBG structure as a basic structure. More specifically, the conductor element 121 corresponds to the head part of a mushroom and forms capacitance along with the opposed conductor 111. The conductor element 141 corresponds to the head part of the mushroom and forms capacitance along with the opposed conductor 131.

The inductance-increased EBG structure can be expressed by an equivalent circuit in which a parallel plate is shunted with a serial resonance circuit including the capacitance and the inductance and the resonance frequency of the serial resonance circuit gives the central frequency of a bandgap. Accordingly, by causing the conductor element 121 to approach the conductor 111 forming the capacitance to increase the capacitance or extending the length of the inductor to increase the inductance, it is possible to achieve a fall in frequency of the bandgap range. However, even when the conductor element 121 is not made to approach the opposed conductor 111, the substantial effect of the invention is not affected at all. By causing the conductor element 141 to approach the conductor 131 forming the capacitance to increase the capacitance or extending the length of the inductor to increase the inductance, it is possible to achieve a fall in frequency of the bandgap range. However, even when the conductor element 141 is not made to approach the opposed conductor 131, the substantial effect of the invention is not affected at all.

Figure 4:
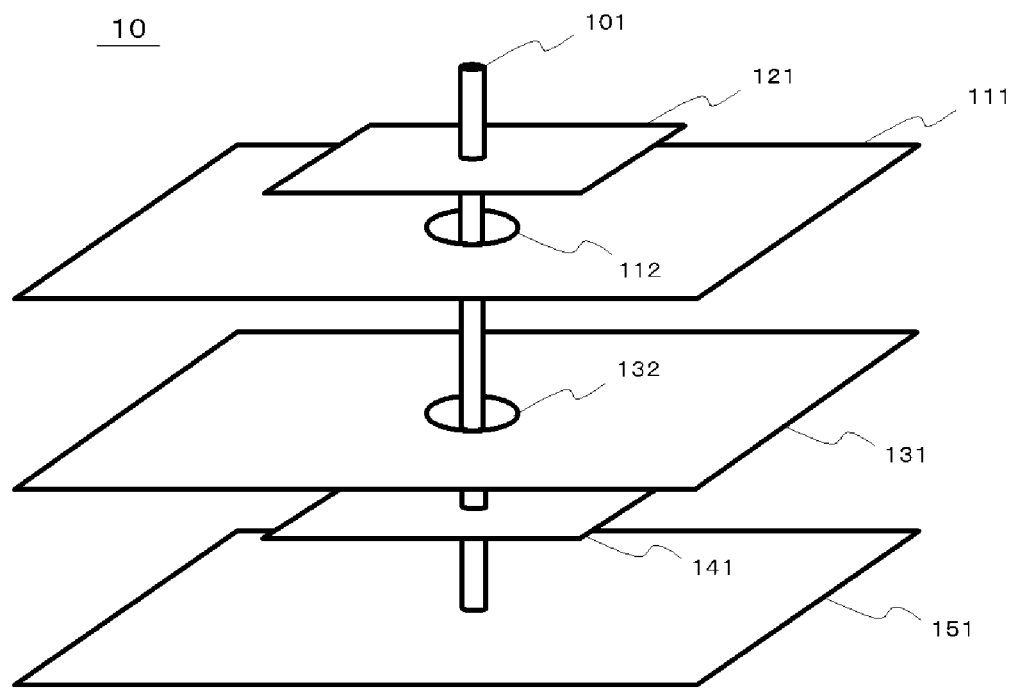
FIG. 4 is a perspective view illustrating an example of a structure according to an embodiment of the invention.

FIG. 4 is a perspective view illustrating an example of the structure 10 according to this embodiment. In the structure 10 shown in FIG. 4, the conductor 151, the conductor element 141, the conductor 131, the conductor 111, and the conductor element 121 are sequentially stacked in this order with respect to the conductor 151. The order of the elements is changed, but the characteristics of the EBG structure shown in FIG. 4 are the same as in the structure 10 shown in FIG. 1.

The conductor element 121 or the conductor element 141 in the structure 10 shown in FIG. 4 may have the shape shown in FIG. 3(B). Here, the structure 10 similarly has the characteristics of the above-mentioned open stub type EBG structure. The conductor element 121 or the conductor element 141 in the structure 10 shown in FIG. 4 may have the shape shown in FIG. 3(C). Here, the structure 10 similarly has the characteristics of the inductance-increased EBG structure described with reference to FIG. 3(C).

Figure 5:
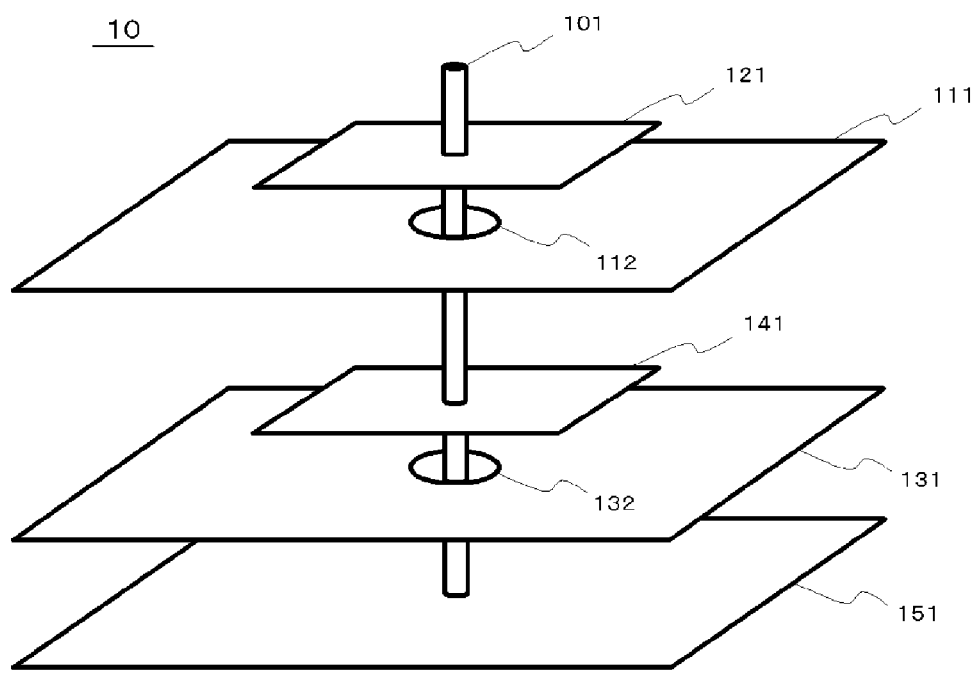
FIG. 5 is a perspective view illustrating an example of a structure according to an embodiment of the invention.

FIG. 5 is a perspective view illustrating an example of the structure 10 according to this embodiment. In the structure 10 shown in FIG. 5, the conductor 151, the conductor 131, the conductor element 141, the conductor 111, and the conductor element 121 are sequentially stacked in this order with respect to the conductor 151. The order of the elements is changed, but the characteristics of the EBG structure shown in FIG. 5 are the same as in the structure 10 shown in FIG. 1.

The conductor element 121 or the conductor element 141 in the structure 10 shown in FIG. 5 may have the shape shown in FIG. 3(B). Here, the structure 10 similarly has the characteristics of the above-mentioned open stub type EBG structure. The conductor element 121 or the conductor element 141 in the structure 10 shown in FIG. 5 may have the shape shown in FIG. 3(C). Here, the structure 10 similarly has the characteristics of the inductance-increased EBG structure described with reference to FIG. 3(C).

Figure 6:
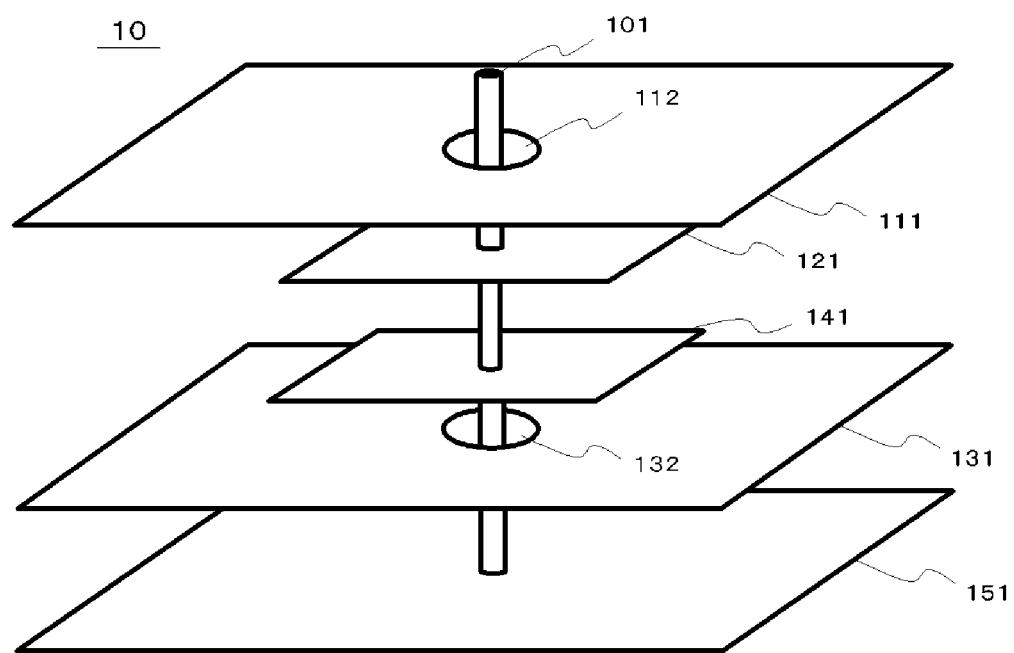
FIG. 6 is a perspective view illustrating an example of a structure according to an embodiment of the invention.

FIG. 6 is a perspective view illustrating an example of the structure 10 according to this embodiment. In the structure 10 shown in FIG. 6, the conductor 151, the conductor 131, the conductor element 141, the conductor element 121, and the conductor 111 are sequentially stacked in this order with respect to the conductor 151. The order of the elements is changed, but the characteristics of the EBG structure shown in FIG. 6 are the same as in the structure 10 shown in FIG. 1.

The conductor element 121 or the conductor element 141 in the structure 10 shown in FIG. 6 may have the shape shown in FIG. 3(B). Here, the structure 10 similarly has the characteristics of the above-mentioned open stub type EBG structure. The conductor element 121 or the conductor element 141 in the structure 10 shown in FIG. 6 may have the shape shown in FIG. 3(C). Here, the structure 10 similarly has the characteristics of the inductance-increased EBG structure described with reference to FIG. 3(C).

Figure 7:
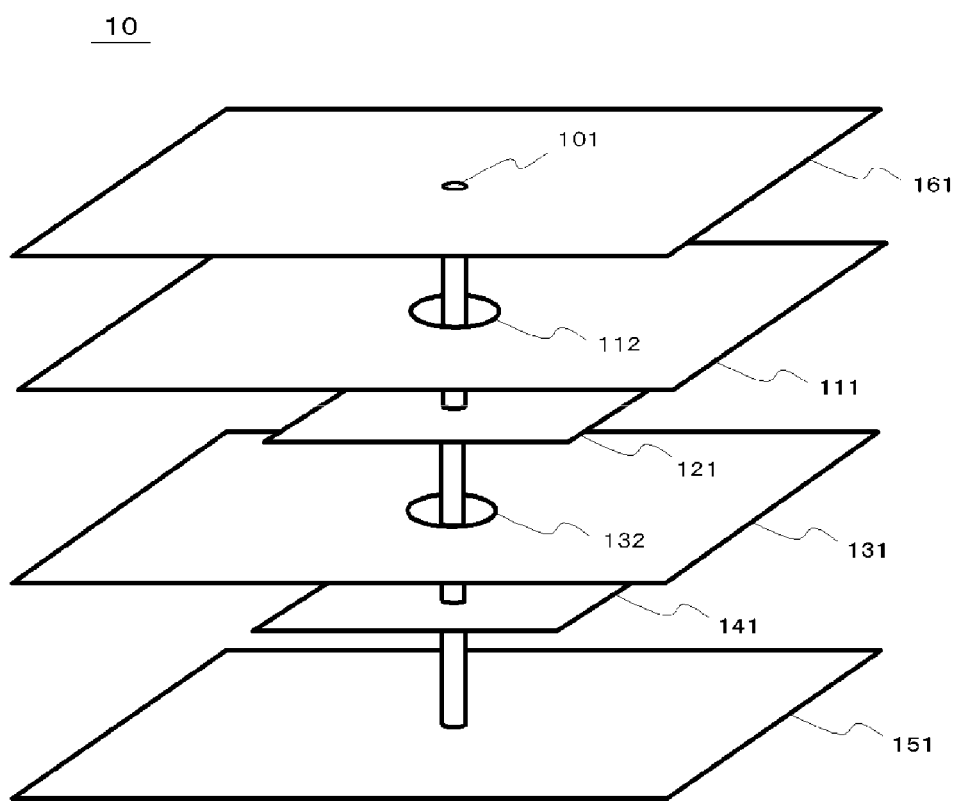
FIG. 7 is a perspective view illustrating an example of a structure according to an embodiment of the invention.

FIG. 7 is a perspective view illustrating an example of the structure 10 according to this embodiment. The structure 10 shown in FIG. 7 has a configuration in which a conductor 161 that is opposed to the conductor 151 with the conductor 111 and the conductor 131 interposed therebetween and that is connected to the connection member 101 is added to the structure 10 shown in FIG. 1.

More specifically, in the structure 10 shown in FIG. 7, the conductor 161, the conductor 111, the conductor element 121, the conductor 131, the conductor element 141, and the conductor 151 are sequentially arranged in this order from the upside of the drawing. The structure 10 includes the conductor 151, and the conductor 111 and the conductor 131 that are located on the same side with respect to the conductor 151, that are opposed to at least a part of the conductor 151, and that overlap each other when seen in a plan view. The structure 10 includes the connection member 101 that penetrates the conductor 161, the conductor 111, the conductor 131, and the conductor 151, that is connected to the conductor 161 and the conductor 151, and that is insulated from the conductor 111 and the conductor 131. The structure 10 includes an opening 112 and an opening 132 that are disposed in the conductor 111 and the conductor 131, respectively, and which the connection member 101 passes through. The structure 10 includes the conductor element 121 that is formed to be opposed to the opening 112 and that is connected to the connection member 101 passing through the opening. The structure 10 includes the conductor element 141 that is formed to be opposed to the opening 132 and that is connected to the connection member 101 passing through the opening. The opening 112 and the conductor element 121 are opposed to each other without another conductor interposed therebetween and the opening 132 and the conductor element 141 are opposed to each other without another conductor interposed therebetween.

Figure 8:
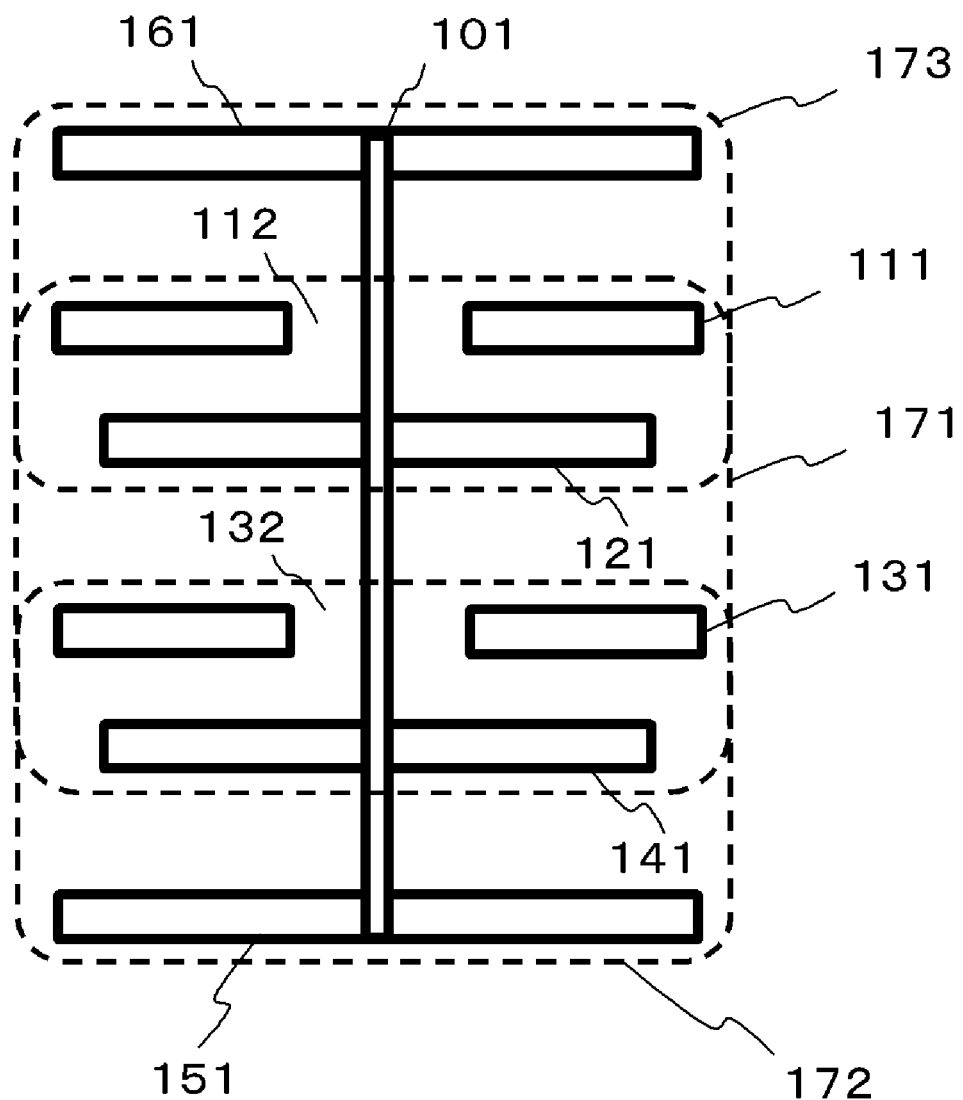
FIG. 8 is a cross-sectional view of the structure shown in FIG. 7.

FIG. 8 is a cross-sectional view of the structure 10 shown in FIG. 7. In FIG. 8, the spaces surrounded with dotted lines indicate EBG structures, which are referred to as an EBG structure 171, an EBG structure 172, and an EBG structure 173. The EBG structure 171 is constituted by the conductor 111, the conductor 131, the conductor element 121, the conductor element 141, and the connection member 101. The EBG structure 172 is constituted by the conductor 131, the conductor 151, the conductor element 141, and the connection member 101. The EBG structure 173 is constituted by the conductor 161, the conductor 111, the conductor element 121, and the connection member 101.

That is, the single structure 10 constitutes the EBG structure 171, the EBG structure 172, and the EBG structure 173. The conductor 131 and the conductor element 141 are shared by both the EBG structure 171 and the EBG structure 172. The conductor 111 and the conductor element 121 are shared by both the EBG structure 171 and the EBG structure 173. The connection member 101 is shared by the EBG structure 171, the EBG structure 172, and the EBG structure 173.

As described above, it can be seen that the structure 10 shown in FIG. 7 or 8 has a configuration in which the EBG structures are combined more complex, compared with the structure 10 shown in FIG. 1 or 2.

The structures 10 described with reference to FIGS. 1 to 6 all include the connection member 101 as a constituent. The connection member 101 may be formed by the use of a build-up method of repeatedly performing a stacking process, a through-hole forming process, and an interconnect forming process for each layer. The connection member 101 may be a penetration via. When the connection member 101 is a penetration via, the structure 10 is manufactured through the following manufacturing processes.

First, (a) the conductor 111, the conductor 131, the conductor 151, the conductor element 121, and the conductor element 141 are stacked to oppose each other and to be formed in different layers. Then, (b) a through-hole is formed which penetrates the conductor 111, the conductor 131, the conductor 151, the conductor element 121, and the conductor element 141 and the connection member 101 that connects at least one of the conductors 111, 131, and 151 to the conductor element 121 and the conductor element 141 is formed in the through-hole. When there is any constituent not shown, the constituent is preferably arranged appropriately in the process of (a). In the process of (b), the method of forming the through-hole is not particularly limited as long as it is applicable, and for example, the through-hole may be formed with a drill. In the process of (b), the method of forming the connection member 101 is not particularly limited as long as it is applicable, and for example, the connection member may be formed by plating the inner surface of the through-hole.

The method of manufacturing the structure 10 described with reference to FIG. 7 or 8 is the same as the above-mentioned manufacturing method, except that the conductor 161 is added as a new constituent.

By forming a penetration via as the connection member to connecting the constituents after stacking the necessary constituents, it is possible to reduce the number of manufacturing processes and thus to reduce the manufacturing cost, compared with the build-up method.

Figure 9:
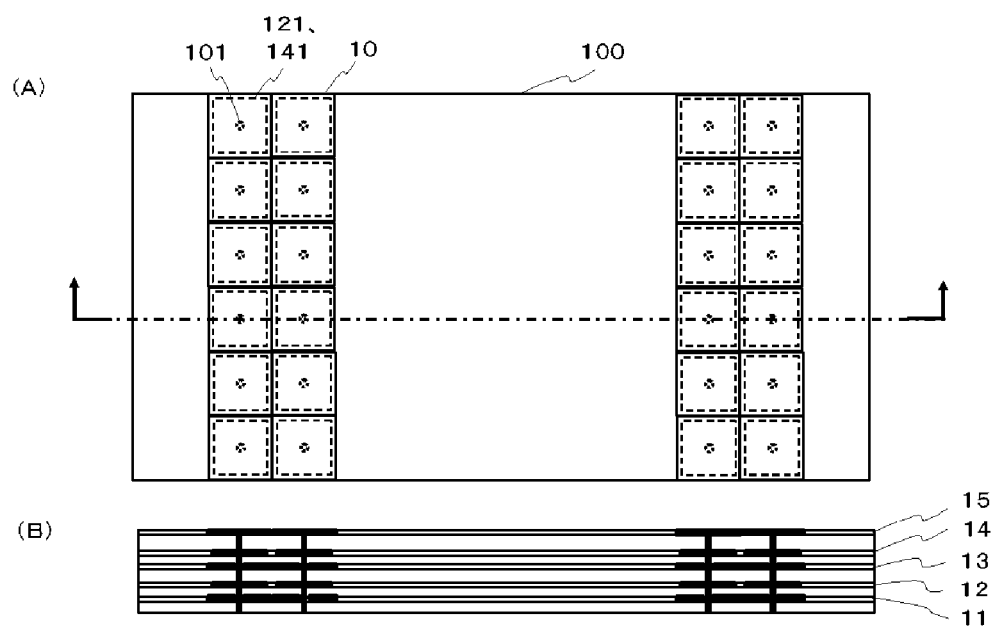
FIG. 9 shows a top view and a cross-sectional view of a circuit board according to an embodiment of the invention.

FIG. 9 shows a top view and a cross-sectional view of the circuit board 100 according to this embodiment. More specifically, FIG. 9(A) is a top view of the circuit board 100 and FIG. 9(B) is a cross-sectional view taken along the indicated sectional line in FIG. 9(A). In FIG. 9(A), squares indicated by dotted lines represent the conductor element 121 formed in the B layer 12 or the conductor element 141 formed in the D layer 14 in each of the structures 10 which are repeatedly arranged. In FIG. 9(A), circles in the squares indicated by dotted lines represent the connection member 101 formed in each of the structures 10 which are repeatedly arranged. Here, in FIG. 9, it is assumed that the structure 10 described with reference to FIG. 1 is vertically inverted and is then repeatedly arranged and the structures 10 are illustrated with black in FIG. 9(B). That is, in the circuit board 100, the E layer 15, the D layer 14, the C layer 13, the B layer 12, and the A layer 11 are sequentially stacked in this order from the upside of the drawing. In the respective structures 10, the conductor 151, the conductor element 141, the conductor 131, the conductor element 121, and the conductor 111 are sequentially arranged from the upside of the drawing.

As shown in FIG. 9, the conductor elements 121 located in the B layer 12 are connected to the different connection members 101, respectively. The conductor elements 141 located in the D layer 14 are connected to the different connection members 101, respectively.

The A layer 11, the B layer 12, the C layer 13, the D layer 14, and the E layer 15 may further include constituents other than the constituents shown in the drawing, such as transmission lines transmitting electrical signals. The circuit board 100 may include layers other than the A layer 11, the B layer 12, the C layer 13, the D layer 14, and the E layer 15, and these layers may include constituents other than the above-mentioned constituents, such as transmission lines. Here, when the transmission lines are disposed in a region in which the structure 10 is repeatedly arranged in the circuit board 100 and in the vicinity of the region, the characteristics of the EBG structures constituted by the structures 10 vary and thus it is preferable to avoid this arrangement.

In the circuit board 100, it is possible to suppress the propagation of electromagnetic waves of the bandgap range in the region in which the structure 10 is repeatedly arranged. That is, the structures 10 have only to be arranged to surround a noise source generating the electromagnetic waves of the bandgap range or elements to be protected from the electromagnetic waves of a specific frequency band and the arrangement pattern thereof may include various examples.

Figure 10:
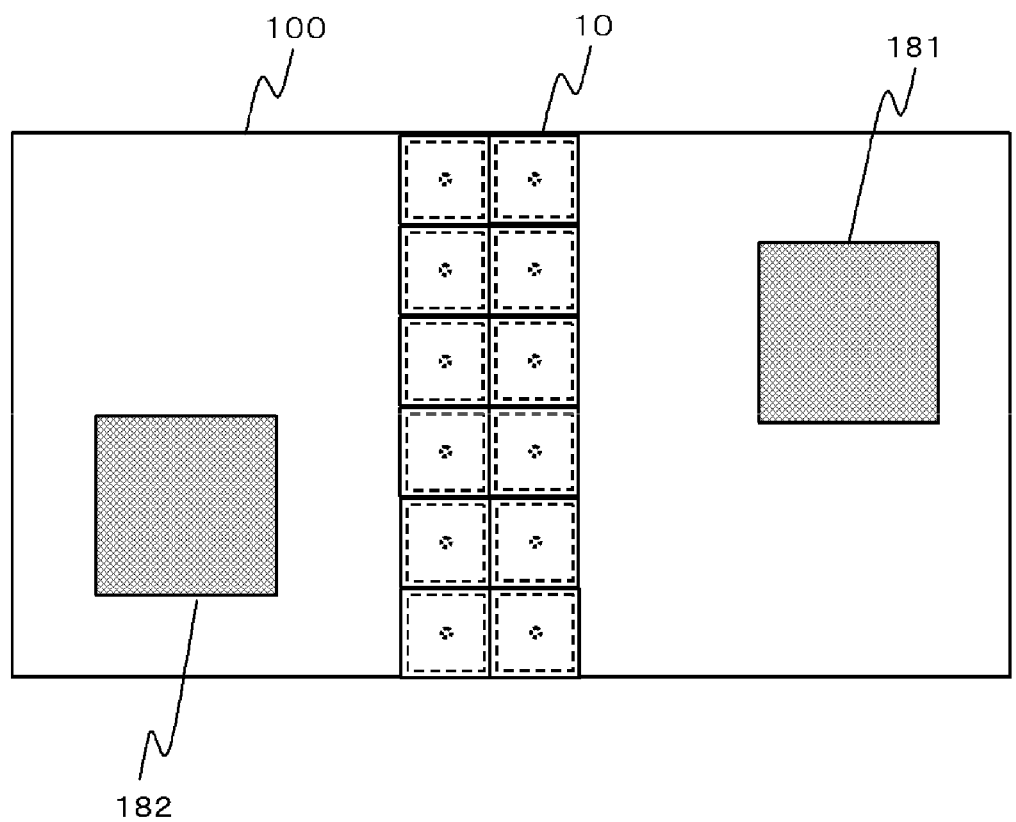
FIG. 10 is a diagram illustrating an arrangement pattern of a structure which can be employed by a circuit board.
Figure 11:
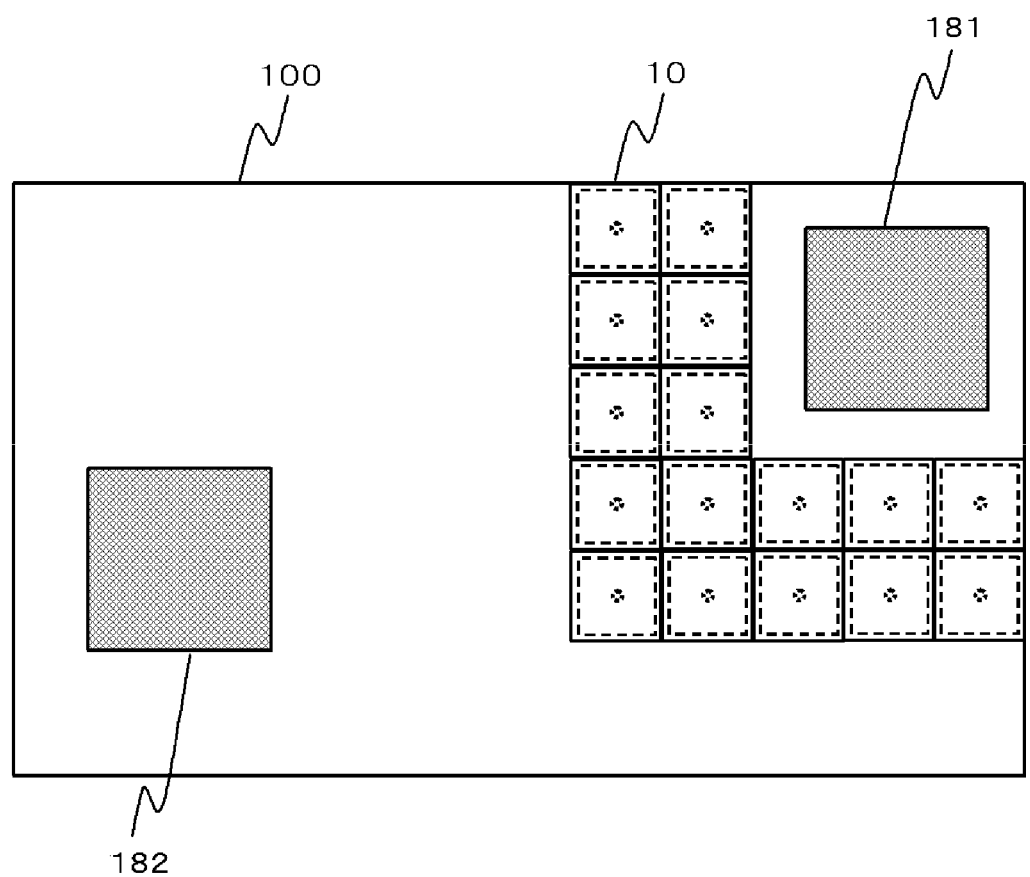
FIG. 11 is a diagram illustrating an arrangement pattern of a structure which can be employed by a circuit board.
Figure 12:
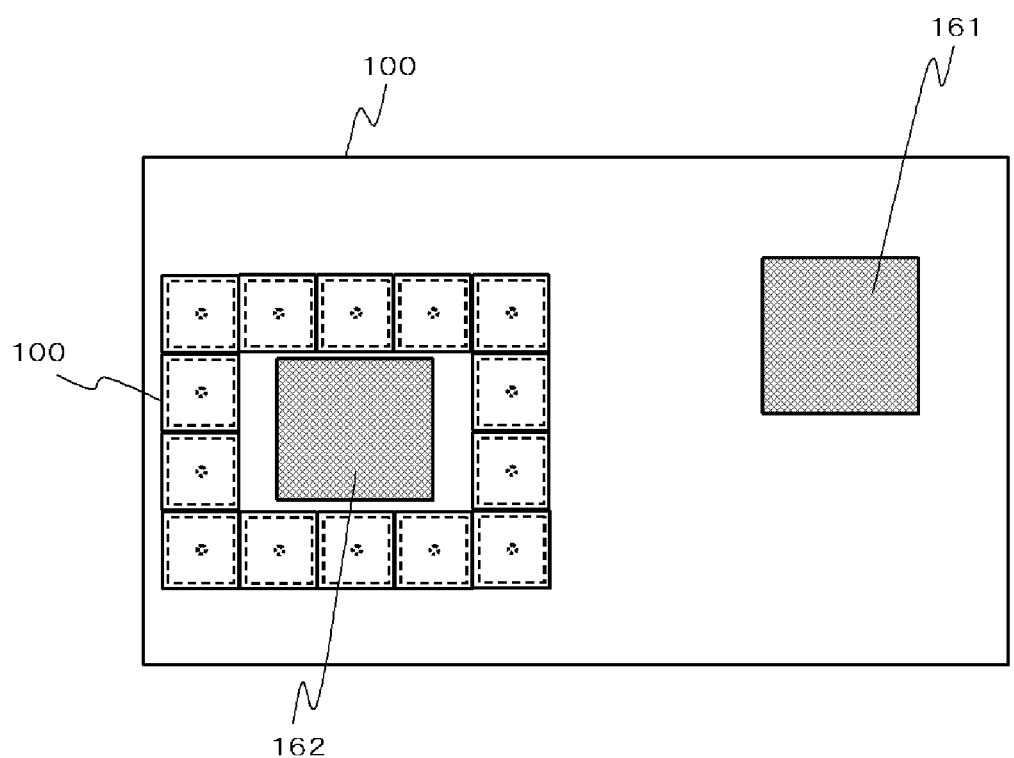
FIG. 12 is a diagram illustrating an arrangement pattern of a structure which can be employed by a circuit board.

FIGS. 10 to 12 are diagrams illustrating the arrangement patterns of the structures 10 which can be employed by the circuit board 100. Here, the meshed members in FIGS. 10 to 12 are a semiconductor package 181 and a semiconductor package 182. As shown in FIG. 10, the structures 10 may be arranged in a band shape between the semiconductor package 181 and the semiconductor package 182. The structures 10 may be arranged to surround the semiconductor package 181 as shown in FIG. 11 or the structures 10 may be arranged to surround the semiconductor package 182 as shown in FIG. 12.

Even when electromagnetic waves to be suppressed propagate in any direction, it is possible to more effectively suppress the propagation of the electromagnetic waves by arranging the plural structures 10 so as to pass the electromagnetic waves therethrough. Accordingly, like the arrangement pattern shown in FIG. 10 or 11, the arrangement pattern in which the plural structures 10 are arranged in parallel in the direction from one semiconductor package to the other semiconductor package is more desirable than the arrangement pattern shown in FIG. 12.

The effects of this embodiment will be described below. The structure 10 can constitute the EBG structures by the use of the conductors 111, 131, and 151, the conductor elements 121 and 141, and the connection member 101. Accordingly, in the structure 10, it is possible to suppress noise propagating in the parallel plate including the conductor 111 and the conductor 131 and noise propagating in the parallel plate including the conductor 131 and the conductor 151. In the circuit board 100, it is possible to suppress noise propagating between the A layer 11 and the C layer 13 and noise propagating between the C layer 13 and the E layer 15 by arranging the structures 10 in a region in which noise should be prevented from propagating.

The inventors found that the EBG structure can be constituted between the parallel plates including the conductors having the openings by arranging at least one conductor element to oppose each opening passing through the connection member and connecting the conductor element to the connection member. All the structures 10 described in this embodiment are invented on the basis of this found idea. In the structures 10, since the number of layers in which the conductor elements are formed is suppressed to as minimum as possible, it is possible to manufacture the circuit board 100 employing the structures 10 according to this embodiment with a smaller thickness.

While the embodiments of the invention have been described with reference to the accompanying drawings, these embodiments are only examples, and various configurations not described above may be employed.

For example, the number of the second conductors (the conductor 131 and the conductor 151 in the above-mentioned embodiments) of the invention is set to two in the above-mentioned embodiments, but maybe set to three or more. As the number of the second conductors increases, the number of layers of the structure or the circuit board increases. Here, when the number of parallel plates in which the propagation of noise should be suppressed increases, the number of layers in which the conductor elements corresponding to the second conductors of the invention should be formed may be made to increase.

The above-mentioned embodiments are on the premise that noise propagating in the parallel plate including the conductor 111 and the conductor 131 and noise propagating in the parallel plate including the conductor 131 and the conductor 151 should be suppressed or on the premise that noise propagating between the A layer 11 and the C layer 13 and noise propagating between the C layer 13 and the E layer 15 should be suppressed, but the invention is not limited to this premise. That is, the EBG structure may be constructed to suppress at least one of the noise propagating in the parallel plate including the conductor 111 and the conductor 131 and the noise propagating in the parallel plate including the conductor 131 and the conductor 151. The EBG structure may be constructed to suppress at least one of the noise propagating between the A layer 11 and the C layer 13 and the noise propagating between the C layer 13 and the E layer 15. Here, at least one of the conductor element 121 and the conductor element 141 may be removed from the structure 10 described in the above-mentioned embodiments. The number of layers in which the conductor elements (the third conductor) are located may be smaller than the number of layers in which the conductors (the second conductors) having the opening are located, or the number of conductor elements may be smaller than the number of openings through which the connection member passes.

In the above-mentioned embodiments, all the structures 10 have a single connection member 101, but the invention is not limited to this configuration. That is, a configuration in which plural structures 10 described in the above-mentioned embodiments are connected may be considered as a single structure. Accordingly, in this structure, plural connection members are repeatedly arranged and the conductor elements located in the same layer are connected to different connection members, respectively.

Priority is claimed on Japanese Patent Application No. 2010-051091, filed Mar. 8, 2010, the content of which is incorporated herein by reference.

What is claimed is:

1. A structure comprising:
   a first conductor;
   a plurality of second conductors that are located on the same side with respect to the first conductor, that are opposed to at least a part of the first conductor, and that overlap each other when seen in a plan view;
   a connection member that penetrates the first conductor and the plurality of second conductors, that is connected to the first conductor, and that is insulated from the second conductors;
   openings that are formed in the plurality of second conductors, respectively, and which the connection member passes through; and
   third conductors that are formed to be opposed to the openings, that are connected to the connection member passing through the openings, and that are larger than the openings,
   wherein a first number of layers in which the third conductors are located is two or more and less than or equal to a second number of layers in which the second conductors are located,
   wherein a plurality of the connection members are repeatedly arranged,
   wherein the openings are formed in the second conductors to correspond to the connection members, and
   wherein the third conductors located in the same layer are connected to different of the connection members, respectively, and are opposed to the different openings, respectively.

2. The structure according to claim 1, wherein at least one of the third conductors is opposed to each of the openings.

3. The structure according to claim 1, wherein the first conductor, one of the second conductors, one of the third conductors, another of the second conductors, and another of the third conductors are stacked in this order with respect to the first conductor.

4. The structure according to claim 1, wherein the connection member is a penetration via.

5. The structure according to claim 1, wherein a first parallel plate formed by the first conductor and one of the second conductors and a second parallel plate formed by the plurality of second conductors constitute an electromagnetic bandgap structure along with the connection member and the third conductor.

6. A structure comprising:
   a first conductor;
   a plurality of second conductors that are located on the same side with respect to the first conductor, that are opposed to at least a part of the first conductor, and that overlap each other when seen in a plan view;
   a connection member that penetrates the first conductor and the plurality of second conductors, that is connected to the first conductor, and that is insulated from the second conductors;
   openings that are formed in the plurality of second conductors, respectively, and which the connection member passes through;
   third conductors that are formed to be opposed to the openings, that are connected to the connection member passing through the openings, and that are larger than the openings,
   wherein a first number of layers in which the third conductors are located is two or more and less than or equal to a second number of layers in which the second conductors are located;
   a fourth conductor that is opposed to the first conductor with the plurality of second conductors interposed and that is connected to the connection member.

7. A structure comprising:
   a first conductor;
   a plurality of second conductors that are located on the same side with respect to the first conductor, that are opposed to at least a part of the first conductor, and that overlap each other when seen in a plan view;
   a connection member that penetrates the first conductor and the plurality of second conductors, that is connected to the first conductor, and that is insulated from the second conductors;
   openings that are formed in the plurality of second conductors, respectively, and which the connection member passes through; and
   third conductors that are formed to be opposed to the openings, that are connected to the connection member passing through the openings, and that are larger than the openings,
   wherein a first number of layers in which the third conductors are located is two or more and less than or equal to a second number of layers in which the second conductors are located,
   wherein at least two of the second conductors closer to any of the plurality of third conductors located in different layers than the other second conductors are continuous in the thickness direction.

8. A structure comprising:
   a first conductor;
   a plurality of second conductors that are located on the same side with respect to the first conductor, that are opposed to at least a part of the first conductor, and that overlap each other when seen in a plan view;
   a connection member that penetrates the first conductor and the plurality of second conductors, that is connected to the first conductor, and that is insulated from the second conductors;
   openings that are formed in the plurality of second conductors, respectively, and which the connection member passes through; and
   third conductors that are formed to be opposed to the openings that are connected to the connection member passing through the openings, and that are larger than the openings,
   wherein a first number of layers in which the third conductors are located is two or more and less than or equal to a second number of layers in which the second conductors are located,
   wherein the first conductor, one of the third conductors, one of the second conductors, another of the third conductors, and another of the second conductors are stacked in this order with respect to the first conductor.

9. A structure comprising:
a first conductor;
a plurality of second conductors that are located on the same side with respect to the first conductor, that are opposed to at least a part of the first conductor, and that overlap each other when seen in a plan view;
a connection member that penetrates the first conductor and the plurality of second conductors, that is connected to the first conductor, and that is insulated from the second conductors;
openings that are formed in the plurality of second conductors, respectively, and which the connection member passes through; and
third conductors that are formed to be opposed to the openings, that are connected to the connection member passing through the openings, and that are larger than the openings,
wherein a first number of layers in which the third conductors are located is two or more and less than or equal to a second number of layers in which the second conductors are located,
wherein the first conductor, one of the second conductors, one of the third conductors, another of the third conductors, and another of the second conductors are stacked in this order with respect to the first conductor.

10. A structure comprising:
a first conductor;
a plurality of second conductors that are located on the same side with respect to the first conductor, that are opposed to at least a part of the first conductor, and that overlap each other when seen in a plan view;
a connection member that penetrates the first conductor and the plurality of second conductors, that is connected to the first conductor, and that is insulated from the second conductors;
openings that are formed in the plurality of second conductors, respectively, and which the connection member passes through; and
third conductors that are formed to be opposed to the openings that are connected to the connection member passing through the openings, and that are larger than the openings,
wherein a first number of layers in which the third conductors are located is two or more and less than or equal to a second number of layers in which the second conductors are located,
wherein the first conductor, one of the third conductors, one of the second conductors, another of the second conductors, and another of the third conductors are stacked in this order with respect to the first conductor.

11. A circuit board having a structure, the structure comprising:
a first conductor;
a plurality of second conductors that are located on the same side with respect to the first conductor, that are opposed to at least a part of the first conductor, and that overlap each other when seen in a plan view;
a connection member that penetrates the first conductor and the plurality of second conductors, that is connected to the first conductor, and that is insulated from the second conductors;
openings that are formed in the plurality of second conductors, respectively, and which the connection member passes through; and third conductors that are formed to be opposed to the openings, that are connected to the connection member passing through the openings, and that are larger than the openings,
wherein a first number of layers in which the third conductors are located is two or more and less than or equal to a second number of layers in which the second conductors are located,
wherein a plurality of the structures are repeatedly arranged.

12. The circuit board according to claim 11, wherein the structure further comprises a fourth conductor that is opposed to the first conductor with the plurality of second conductors interposed and that is connected to the connection member.

13. The circuit board according to claim 11, wherein at least one of the third conductors is opposed to each of the openings.

14. The circuit board according to claim 11, wherein at least two of the second conductors closer to any of the plurality of third conductors located in different layers than the other second conductors are continuous in the thickness direction.

15. The circuit board according to claim 11, wherein the first conductor, one of the third conductors, one of the second conductors, another of the third conductors, and another of the second conductors are stacked in this order with respect to the first conductor.

16. The circuit board according to claim 11, wherein the first conductor, one of the second conductors, one of the third conductors, another of the third conductors, and another of the second conductors are stacked in this order with respect to the first conductor.

17. The circuit board according to claim 11, wherein the first conductor, one of the third conductors, one of the second conductors, another of the second conductors, and another of the third conductors are stacked in this order with respect to the first conductor.

18. The circuit board according to claim 11, wherein the first conductor, one of the second conductors, one of the third conductors, another of the second conductors, and another of the third conductors are stacked in this order with respect to the first conductor.

19. The circuit board according to claim 11, wherein the connection member is a penetration via.

20. The circuit board according to claim 11, wherein a first parallel plate formed by the first conductor and the second conductors and a second parallel plate formed by the plurality of second conductors constitute an electromagnetic bandgap structure along with the connection member and the third conductor.

* * * * *